United States Patent [19]

Nagata

[11] Patent Number: 5,202,685
[45] Date of Patent: Apr. 13, 1993

[54] DIGITAL SIGMA-DELTA MODULATOR HAVING A LIMITER CIRCUIT

[75] Inventor: Mitsuru Nagata, Yokohama, Japan
[73] Assignee: Kabushiki Kaisha Toshiba, Kawasaki, Japan
[21] Appl. No.: 762,375
[22] Filed: Sep. 19, 1991

[30] Foreign Application Priority Data

Sep. 20, 1990 [JP] Japan .................. 2-248855

[51] Int. Cl.[5] ............................................ H03M 3/00
[52] U.S. Cl. ..................................... 341/76; 341/143; 375/27
[58] Field of Search .................... 341/76, 95, 143; 375/25, 26, 27, 28, 30, 33

[56] References Cited

U.S. PATENT DOCUMENTS

| | | |
|---|---|---|
| 4,467,316 | 8/1984 | Musmann et al. |
| 4,692,737 | 9/1987 | Stikvoort et al. |
| 4,986,159 | 1/1991 | Matsushima et al. .......... 84/660 |

OTHER PUBLICATIONS

IEEE International Symposium on Circuits and Systems, pp. 372-375, May 1-3, 1990, T. C. Leslie, et al., "An Improved Sigma-Delta Modulator Architecture".
IEEE J. of Solid-State Circuits, vol. SC-22 No. 3, Jun. 1987, pp. 390-394, "A CMOS Stereo 16-Bit D/A Converter for Digital Audio" P. J. A. Naus et al.
IEEE Journal of Solid-State Circuits, vol. SC-16, No. 4, Aug. 1981, pp. 333-341 "Single-Chip Channel Codec with Filters", Misawa et al.
IEEE Transactions on Circuits and Systems, vol. CAS-25, No. 7, Jul. 1978, pp. 436-447 "Oversampled, Linear Predictive and Noise-Shaping Coders", Tewksbury et al.
"VSLI-A to D and D to A Converters with Multi-Stage Noise Shaping Modulators", ICASSP 86, Tokyo, pp. 1545-1548, Uchimura et al.
"A Multi-Stage Noise Shaping 16bit CMOS D to A Conversion LSI", EA 87-79, pp. 25-32, Matusya et al.

*Primary Examiner*—Jeffrey A. Gaffin
*Assistant Examiner*—Brian K. Young
*Attorney, Agent, or Firm*—Oblon, Spivak, McClelland, Maier & Neustadt

[57] ABSTRACT

A digital sigma-delta modulator comprises an adder, a quantizer, a subtracter, a filter circuit, and a limiter circuit. The adder adds input digital data and feedback data. The quantizer quantizes output data of the adder. The subtracter calculates a difference between output data of the quantizer and that of the adder. The filter circuit digitally processes output data of the subtracter to generate the feedback data. The limiter circuit is arranged in at least one position within an operation loop looping the adder, subtracter, and filter circuit and extracts (n-m)-bit data acquired by eliminating the significant m bit other than MSB from an n-bit data line.

4 Claims, 6 Drawing Sheets

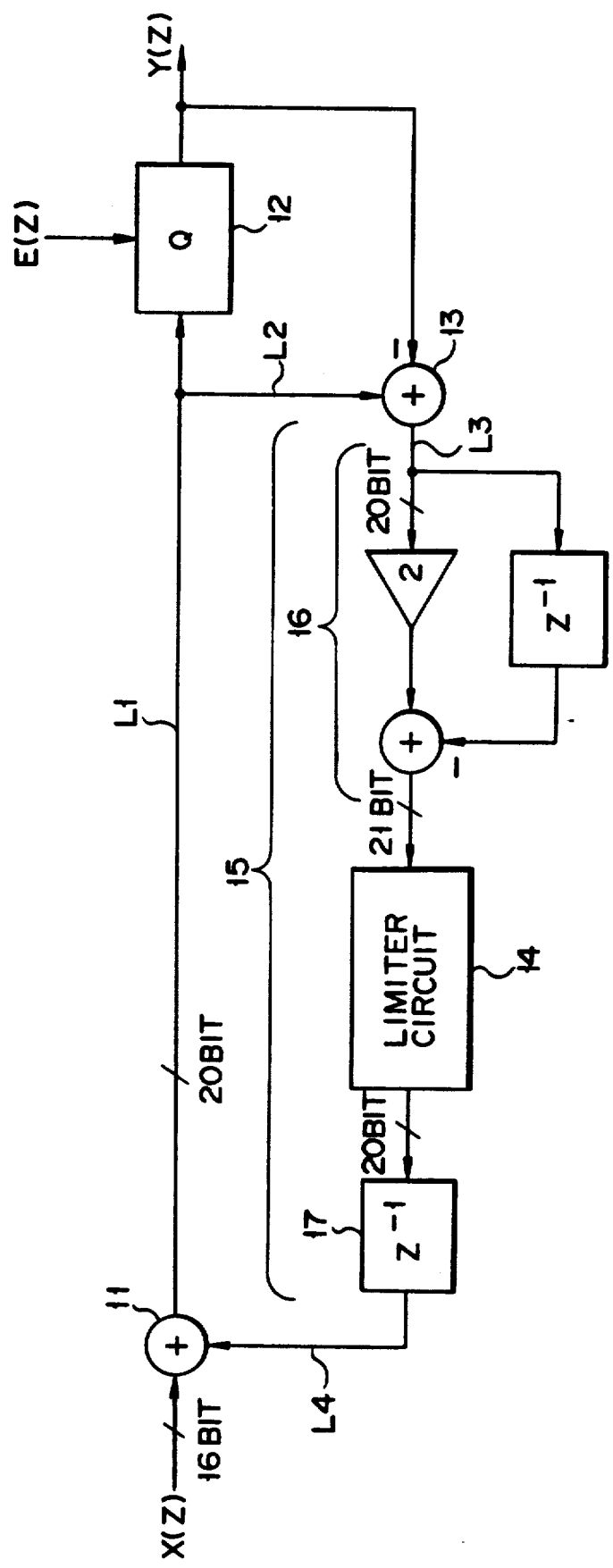
F I G. 3

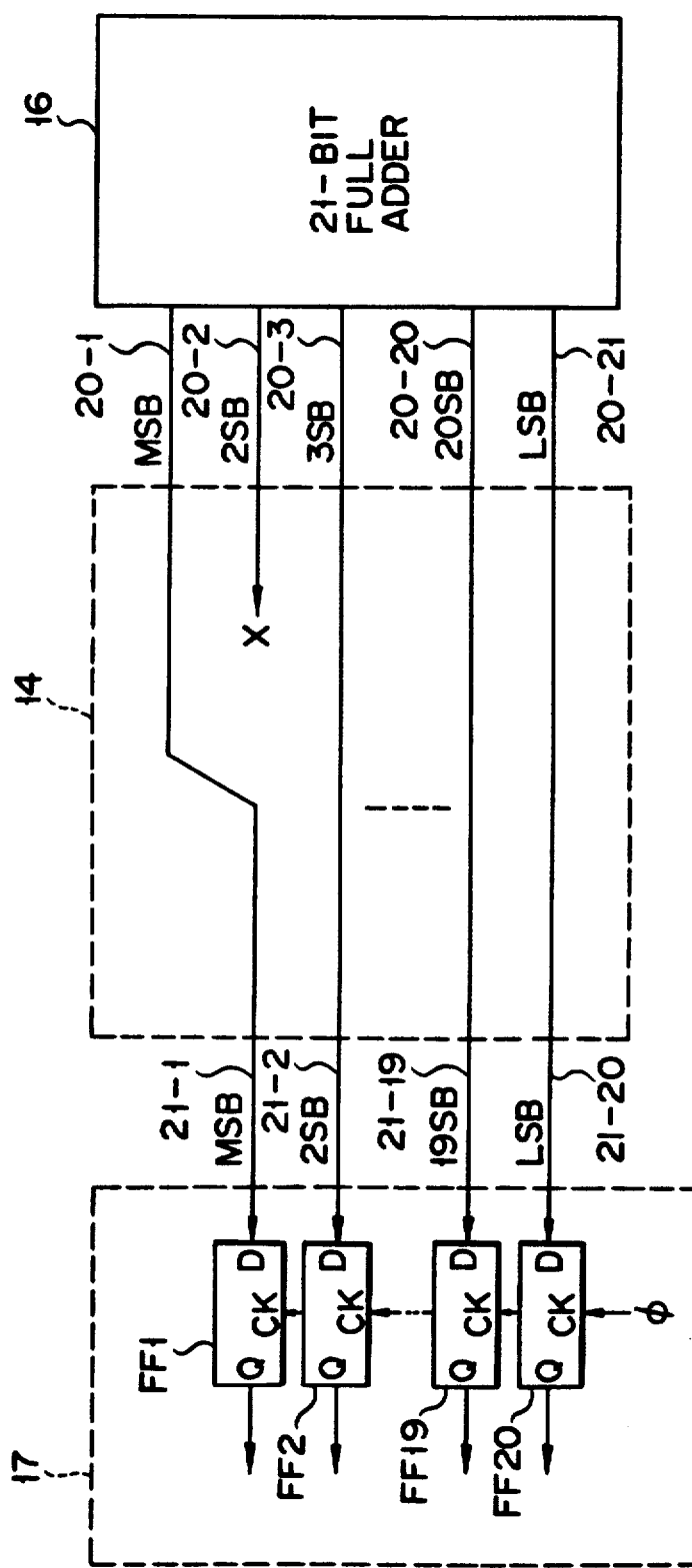
F I G. 4

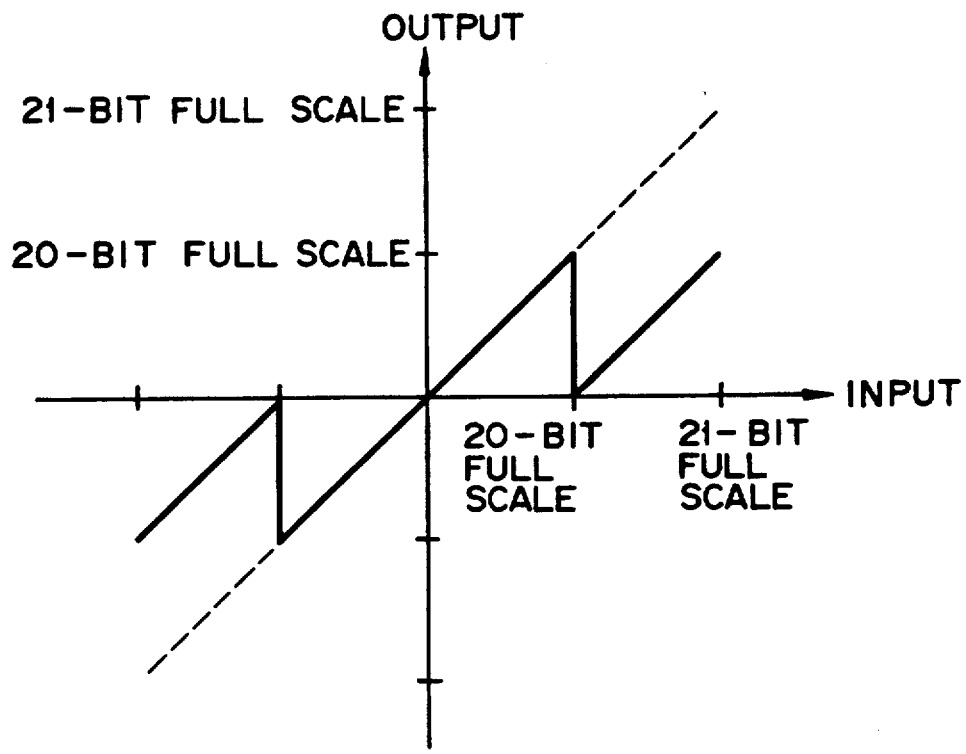
F I G. 5
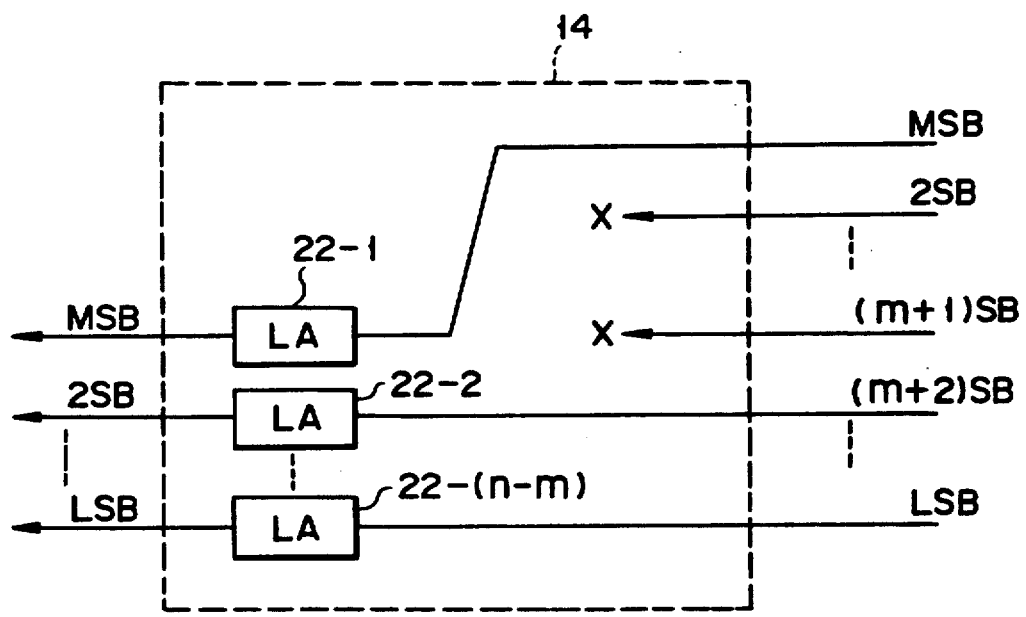
F I G. 8

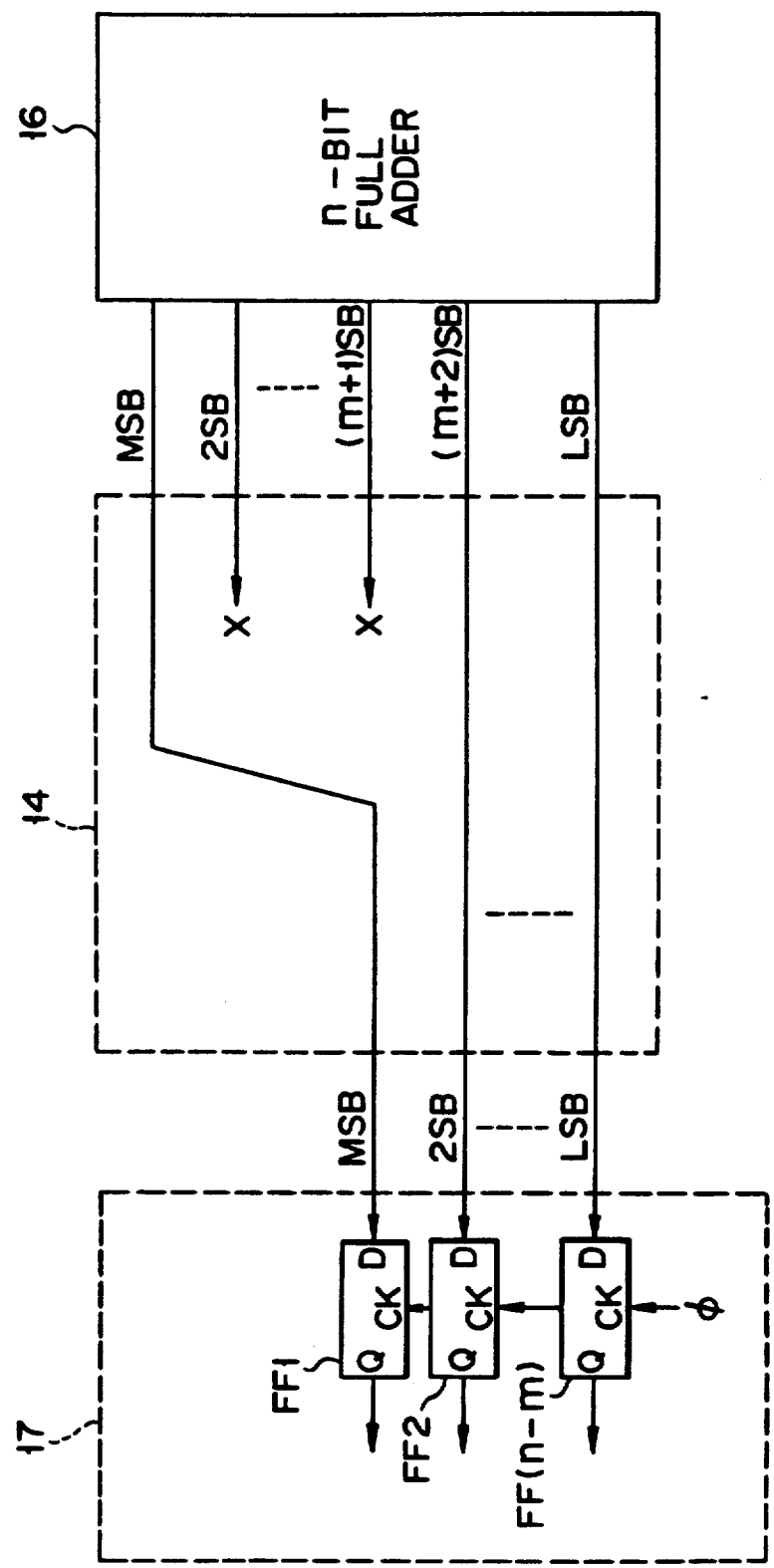
F I G. 6

DIGITAL SIGMA-DELTA MODULATOR HAVING A LIMITER CIRCUIT

BACKGROUND OF THE INVENTION

1. Field of the Invention

The present invention relates to a higher-order digital sigma-delta modulator for use in an oversampling type digital-to-analog converter (DA converter) and, more particularly, a limiter circuit for stabilizing an operation of the sigma-delta modulator.

2. Description of the Related Art

It is known that information of the original signal is not damaged if a sampling frequency is set twice as high as a signal frequency band $f_B$ based on the Nyquist's sampling theorem when an analog signal is encoded as digital data of sampling value. A sampling frequency $f_S$ of a commonly-used DA converter is therefore set to be 2.2 to 2.4 times as high as the signal frequency band $f_B$.

An oversampling type DA converter has recently been developed and put to practical use in which the sampling frequency $f_S$ is set to be considerably higher than the signal frequency band $f_B$ to enhance conversion precision and increase an S/N (signal-to-noise) ratio. If the number of bits (resolution) is expressed by n, the maximal S/N ratio $S/N_{max}$ of a simple oversampling type DA converter is given by the following equation.

$$S/N_{max} = (3/2)2^{2n}(f_S/2f_B) \ldots \quad (1)$$

It is obvious from the above equation (1) that the S/N ratio is improved by 6 dB if the resolution n of the D/A converter is increased by one bit. Even if, however, the sampling frequency $f_S$ is doubled, the S/N ratio is improved by 3 dB only.

Various methods for sufficiently increasing an S/N ratio without heightening the sampling frequency $f_S$ are developed. One of the methods is to use a DA converter having a first order sigma-delta modulator, which is, for example, disclosed in Toshio Misawa et al., "Single-Chip per Channel Codec With Filters Utilizing $\Sigma$-$\Delta$ Modulation," IEEE Journal of Solid-State Circuits, Vol. SC-16, No. 4, August, 1981, pp. 333–341.

This DA converter has transmission characteristics expressed by the following equation.

$$Y(z) = X(z) + (1 - z^{-1})E(z) \ldots \quad (2)$$

In the equation (2), a quantization error $E(z)$ is not usually correlated with an input signal $X(z)$, and the frequency characteristics are flat, so that the noise frequency characteristics are given as follows if a clock period is T.

$$(1 - e^{j\omega T}) \simeq j\omega T \ldots \quad (3)$$

where $\omega T \ll 1$. Since noise is proportionate to frequency, if the signal frequency band $f_B$ is considerably made lower than the sampling frequency $f_S$, the S/N ratio is improved by 9 dB in a signal band every time the sampling frequency $f_S$ is doubled.

A one-bit DA converter having a higher-order sigma-delta modulator is disclosed in Stuart K. Tewksbury et al., "Oversampled, Linear Predictive and Noise-Shaping Coders of Order $N > 1$," IEEE Transactions on Circuits and Systems, Vol. Cas-25, No. 7, July, 1978, pp. 436–447; Kuniharu Uchimura et al., "VLSI A-to-D and D-to-A Converters with Multi-Stage Noise Shaping Modulators," ICASSP 86, Tokyo, pp. 1545–1548; and Yasuyuki Matsuya et al., "A Multi-Stage Noise Shaping 16 bit CMOS D to A conversion LSI", Journal of Institute of Electronic Information Communications, Report on Technical Research into Applied Acoustics, EA-87-79, 1987, pp. 25–32.

The DA converters disclosed in the above three publications basically include an n-stage integrator and differ from a first order sigma-delta modulator in that a feedback signal is supplied to the n-stage integrator. The transmission characteristics of the DA converters are represented by the following equation.

$$Y(z) = X(z) + (1 - z^{-1})^n E(z) \ldots \quad (4)$$

If the degree of the higher-order sigma-delta modulator is n, the S/N ratio is improved by $3 \times (2n + 1)$ dB in the signal band every time the sampling frequency $f_S$ is doubled, and it is also improved much more than using a DA converter having a primary sigma-delta modulator.

When a quantization level is binary (1 bit), the foregoing higher-order sigma-delta modulator needs a limiter circuit to prevent an oscillation mode from being set if the number of stages (n) of the integrator is two or more.

The DA converter including such a limiter circuit is disclosed in P.J.A. Naus et al., "A CMOS Stereo 16-bit D/A Converter For Digital Audio," IEEE Journal of Solid-State Circuits, Vol. Sc-22, No. 3, June, 1987, pp. 390–394. The limiter circuit disclosed in this publication comprises an inverter circuit, an exclusive-OR circuit, and a switch circuit, as shown in FIG. 1.

The limiter circuit shown in FIG. 1 limits data of 21 bits in length to data of 20 bits in length. A data line 90-1 of the most significant bit MSB in 21-bit data lines 90 is connected to one of input terminals of an exclusive-OR circuit 92, an input terminal of an inverter 91, and a data line 100-1 of the most significant bit MSB in 20-bit data lines 100. A data line 90-2 of significant bit 2SB is connected to the other input terminal of the exclusive-OR circuit 92. Data lines 90-3 to 90-21 of bits 3SB to LSB are connected to data lines 100-2 to 100-20 of bits 2SB to LSB through switch circuits SW1 to SW19, respectively. The switch circuits SW1 to SW19 each includes a transmission gate, a clocked inverter, and the like and are switched in response to signals output from the exclusive-OR circuit 92. An output terminal of the inverter 91 is connected to terminals H of the switch circuits SW1 to SW18, and a "1" level signal is supplied to a terminal H of the switch circuit SW19. The data lines 90-3 to 90-21 of the bits 3SB to LSB are connected to terminals L of the switch circuits SW1 to SW19, respectively. The switch circuits SW1 to SW19 are switched to the terminals H when the output signal of the exclusive-OR circuit 92 is "1" in level, and they are switched to the terminals L when the output signal is "0" in level.

In the arrangement described above, when both the data lines 90-1 and 90-2 of MSB and 2SB are "0" in level, the output signal of the exclusive-OR circuit 92 becomes "0" in level, and the switch circuits SW1 to SW19 are switched to the terminals L. The data lines 90-3 to 90-21 of 3SB to LSB are connected to the data lines 100-2 to 100-20 of 2SB to LSB, respectively. Data supplied to the data lines 90- and 90-3 to 90-21 is therefore transmitted to the data lines 100-1 to 100-20.

When the data line 90-1 of MSB is "0" in level and the data line of 2SB is "1" in level, the output signal of the exclusive-OR circuit 92 becomes "1" in level, and the switch circuits SW1 to SW19 are switched to the terminals H. A "1" level signal is supplied from the inverter 91 to the data lines 100-2 to 100-19 of 2SB to 19SB, and the "1" level signal is also supplied to the data line 100-20 of LSB. The data lines 100-2 to 100-20 are fixed to "1" in level, regardless of the level of data supplied to the data lines 90-3 to 90-21.

When the data line 90-1 of MSB is "1" in level and the data line 90-2 of 2SB is "0" in level, the output signal of the exclusive-OR circuit 92 becomes "1" in level, and the switch circuits SW1 to SW19 are switched to the terminals H. A "0" level signal is supplied from the inverter 91 to the data lines 100-2 to 100-19 of 2SB to 19SB, and a "1" level signal is supplied to the data line 100-20 of LSB. The data lines 100-2 to 100-19 are fixed to "0" in level and the data line 100-20 is fixed to "1" in level, regardless of the level of data supplied to the data lines 90-3 to 90-21.

When both the data lines 90-1 and 90-2 of MSB and 2SB are "1" in level, the output signal of the exclusive-OR circuit 92 becomes "0" in level, and the switch circuits SW1 to SW19 are switched to the terminals L. The data lines 90-3 to 90-21 of 3SB to LSB are connected to the data lines 100-21 to 100-20 of 2SB to LSB, and data supplied to the data lines 90-3 to 90-21 is transmitted to the data lines 100-2 to 100-20.

The transmission characteristics of the foregoing limiter circuit is shown in FIG. 2. As shown in FIG. 2, if an input exceeds a 20-bit full scale, an output is clamped by the 20-bit full scale and becomes constant. The limiter circuit is relatively complicated and causes a delay of a considerably long period of time, however elaborately the circuit is formed. The sampling frequency $f_S$ cannot sufficiently be increased, and the improvement in S/N ratio is limited.

SUMMARY OF THE INVENTION

It is accordingly an object of the present invention to provide a digital sigma-delta modulator of the second or more order having a simplified limiter circuit for use in an oversampling type digital-to-analog converter which enables a time delay due to the limiter circuit to be neglected and sufficiently increases a sampling frequency $f_S$ to greatly improve in S/N ratio.

To attain the above object, there is provided a digital sigma-delta modulator comprising: an adder for adding input digital data and feedback data; a quantizer for quantizing output data of the adder; a subtracter for calculating a difference between the output data of the adder and that of the quantizer; a filter for digitally processing output data of the subtracter to generate the feedback data; and a limiter, arranged in at least one position within an operation loop which loops the adder, the subtracter, and the filter, for extracting (n-m)-bit data acquired by eliminating a significant m bit other than MSB, from an n-bit data line.

Since the limiter circuit is relatively simple in arrangement and a time delay due to the limiter circuit can be neglected, the sigma-delta modulator can stably be operated. In the oversampling type DA converter, therefore, the S/N ratio can be greatly improved by increasing the sampling frequency $f_S$.

BRIEF DESCRIPTION OF THE DRAWINGS

FIG. 3 is a circuit diagram of a digital sigma-delta modulator according to an embodiment of the present invention;

FIG. 4 is a circuit diagram for explaining an arrangement of a limiter circuit of the modulator shown in FIG. 3;

FIG. 5 is a graph showing transmission characteristics of the limiter circuit shown in FIG. 4;

FIG. 6 is a circuit diagram showing an arrangement of another limiter circuit according to the present invention;

FIG. 8 is a circuit diagram showing an arrangement of still another limiter circuit according to the present invention.

DETAILED DESCRIPTION OF THE PREFERRED EMBODIMENTS

Figure 1:
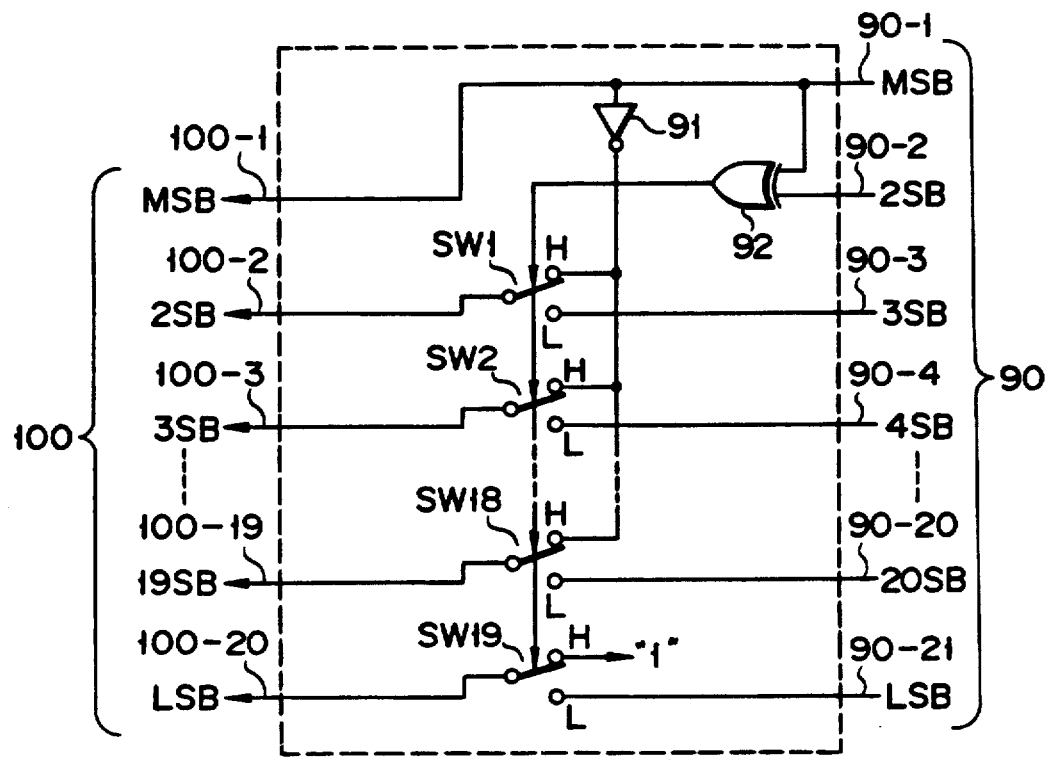
FIG. 1 is a circuit diagram showing an arrangement of a limiter circuit of a conventional higher-order sigma-delta modulator.

FIG. 3 shows a 1-bit DA converter using a second order sigma-delta modulator. In FIG. 3, X(z), Y(z) and E(z) represent a Z-conversion of an input signal, that of an output signal and that of quantization error. The input digital signal X(z) is added to feedback data in an adder 11. An output signal of the adder 11 is supplied to a quantizer 12, then quantized therein, and a difference between the quantized output signal Y(z) and the output signal of the adder 11 is calculated by a subtracter 13. Output data of the subtracter 13 is digitally processed by a filter circuit 15 to serve as feedback data. The filter circuit includes an filter 16 and a one-clock delay circuit 17. A limiter circuit 14 is interposed in the middle of the filter circuit 15, that is, between the filter 16 and one-clock delay circuit 17.

FIG. 4 shows an arrangement of the limiter circuit 14 included in the DA converter shown in FIG. 3. The limiter circuit 14 is so arranged that 20-bit data can be extracted, by eliminating one bit 2SB, from among the bits of the 21-bit data lines. In other words, output signals of a 21-bit full adder included in the integrator 16 are supplied through the limiter circuit 14 to data input terminals D of D-type flip-flops FF1 to FF20 arranged in the one-clock delay circuit 17. Of data output lines of the 21-bit full adder, a data output line 20-1 of MSB is directly connected to a data input line 21-1 of MSB connected to the data input terminal D of the flip-flop FF1. A data output line 20-2 of 2SB is not connected anywhere, and output data of 2SB is neglected. Data output lines 20-3 to 20-21 of 3SB to LSB are directly connected to data input lines 21-2 to 21-20 of 2SB to LSB connected to the data input terminals D of flip-flops FF2 to FF20.

If 20-bit data input lines excluding the data input line of 2SB are directly connected to the data output lines, the limiter circuit can be formed with very simple arrangement.

Figure 2:
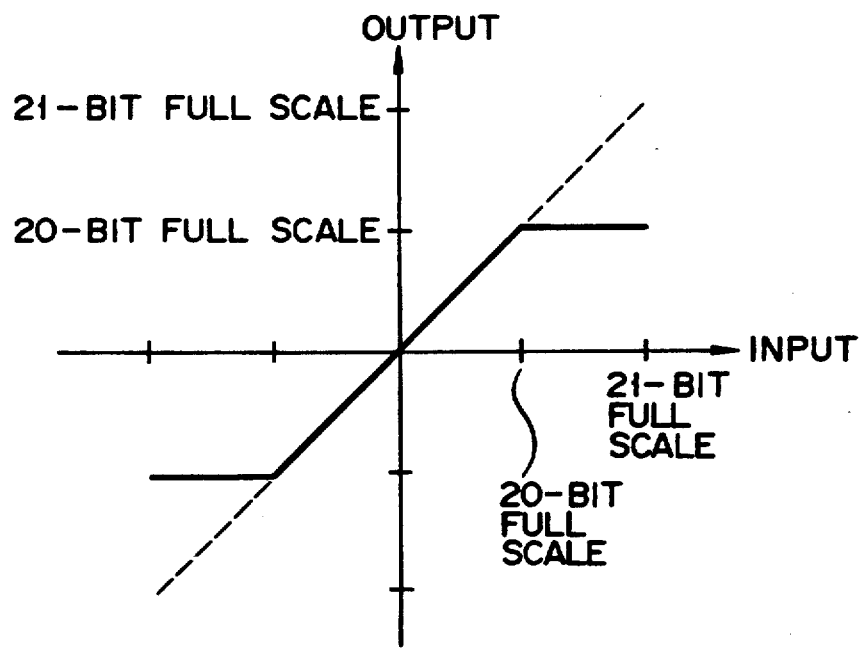
FIG. 2 is a graph showing transmission characteristics of the limiter circuit shown in FIG. 1.

The transmission characteristics of the limiter circuit 14 are saw-tooth wave characteristics as shown in FIG. 5. The saw-tooth wave characteristics differ from the flat clip characteristics as shown in FIG. 2 and seem to be unfavorable for the limiter circuit 14 itself. Since, however, the limiter circuit 14 is not operated in response to a normal signal but to an abnormal large-amplitude signal only, the transmission characteristics need not be flat clip characteristics but have only to be saw-tooth characteristics.

The transmission characteristics of the second order sigma-delta modulator shown in FIG. 3 are given by the following equation.

$$Y(z) = X(z) + (1 + z^{-1})^2 E(z) \ldots \quad (5)$$

The transmission characteristics are the same as those of the conventional DA converter.

FIG. 6 shows another example of the limiter circuit 14 in which n-bit data is clamped by n-m bit. The limiter circuit shown in FIG. 6 is so arranged that (n-m)-bit data can be extracted by eliminating a significant m bit, other than MSB, from among the bits of the n-bit data lines.

Figure 7:
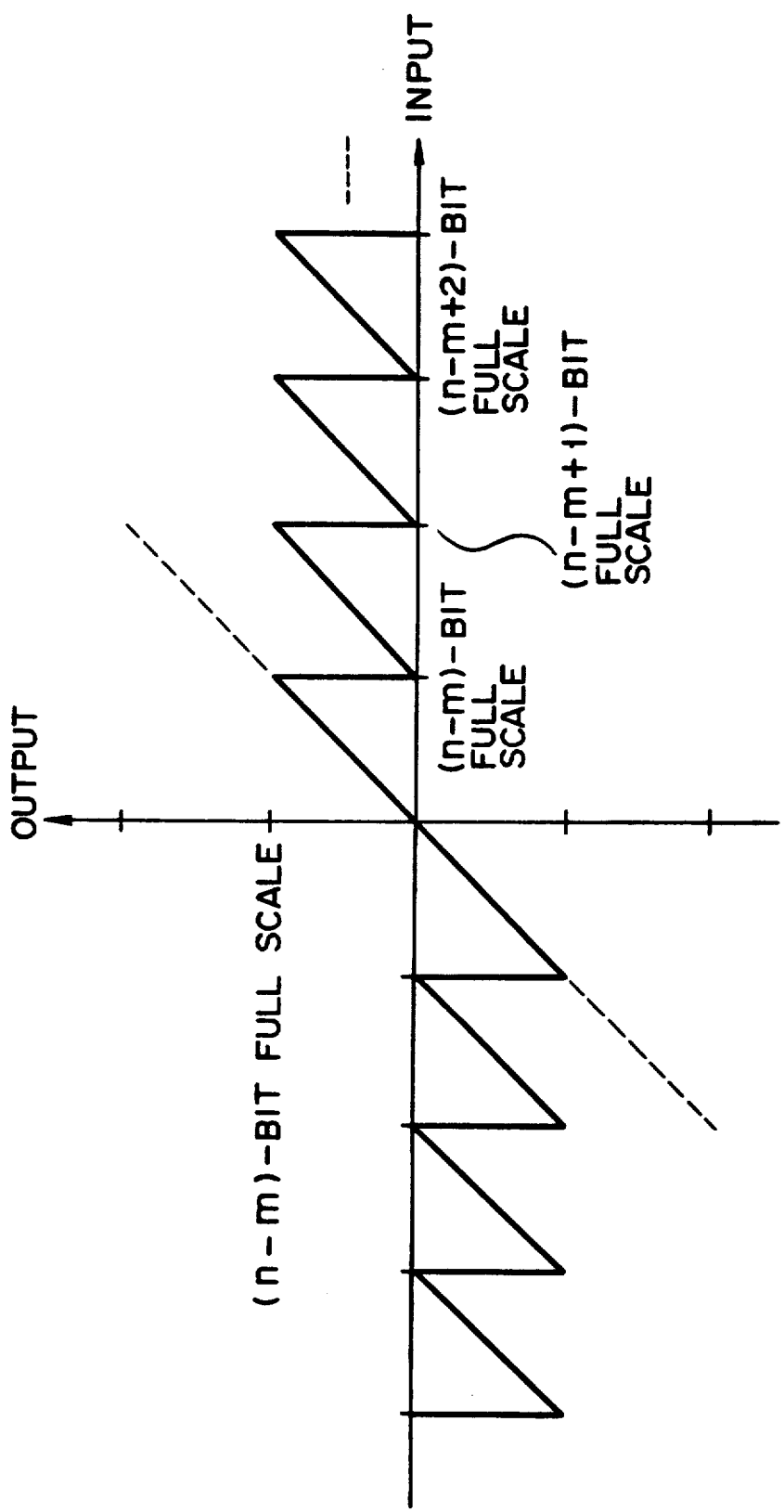
FIG. 7 is a graph showing transmission characteristics of the limiter circuit shown in FIG. 6.

FIG. 7 shows the transmission characteristics of the limiter circuit shown in FIG. 6. The effects of the limiter circuit are the same as those of the circuit shown in FIG. 4.

As shown in FIG. 8, latch circuits 22-1, 22-2, . . . , 22-(n-m) can be arranged between the input data lines and output data lines to latch n-m bit data acquired by eliminating a significant m bit, other than MSB, and to supply the latched data to the next stage.

The position at which the limiter circuit 14 is arranged, is not limited to that shown in FIG. 3. The limiter circuit 14 can be arranged on a data line of an operation loop which loops the adder 11, subtracter 13, and filter circuit 15. More specifically, the limiter circuit can be arranged on data lines L1 and L2 extending from the adder 11 to the subtracter 13, data line L3 extending from the subtracter 13 to the integrator 16, and data line L4 extending from the one-clock delay circuit 17 to the adder 11 in the circuit shown in FIG. 3.

As described above, according to the higher-order digital sigma-delta modulator, since the limiter characteristics are obtained by eliminating the significant m bit other than MSB of the signal line halfway in the operation loop, the arrangement of the limiter circuit is relatively simple, and a time delay is not caused by the limiter circuit or it can be neglected. The over-sampling type DA converter using the digital sigma-delta modulator according to the present invention can be operated at the sampling frequency $f_S$ higher than that of the conventional converter, resulting in the high S/N ratio which has not been conventionally obtained.

What is claimed is:

1. A digital sigma-delta modulator comprising:
   adder means for adding input digital data and feedback data;
   quantizer means for quantizing output data of said adder means;
   subtractor means for calculating a difference between the output data of said adder means and that of said quantizer means;
   filter means for digitally processing output data of said subtractor means to generate the feedback data; and
   limiter means, arranged in at least one position within an operation loop which loops said adder means, said subtractor means, and said filter means, for extracting (n-m)-bit data acquired by eliminating a significant m bit other than MSB, from an n-bit data line, producing a saw-tooth wave output.

2. The digital sigma-delta modulator according to claim 1, wherein said limiter means is so formed that an (n-m)-bit line of input data lines, excluding the significant m bit other than the MSB, is directly connected to output data lines.

3. The digital sigma-delta modulator according to claim 1, further comprising latch means for latching an output of said limiter means.

4. A digital sigma-delta modulator according to claim 1, wherein:
   the limiter means operates to extract the bit data only when the input digital data has an abnormally large amplitude signal.

* * * * *